United States Patent [19]

Hartmann et al.

[11] 4,028,648

[45] June 7, 1977

[54] TUNABLE SURFACE WAVE DEVICE RESONATOR

[75] Inventors: Clinton S. Hartmann; Robert E. Stigall, both of Richardson, Tex.

[73] Assignee: Texas Instruments Incorporated, Dallas, Tex.

[22] Filed: Mar. 8, 1976

[21] Appl. No.: 665,015

[52] U.S. Cl. .................................. 333/72; 310/8.2; 310/9.8; 333/30 R

[51] Int. Cl.² .................. H03H 9/02; H03H 9/26; H03H 9/32; H03H 13/00

[58] Field of Search ............ 333/30 R, 72; 310/8.1, 310/8.2, 9.8

[56] References Cited

UNITED STATES PATENTS

| | | | |
|---|---|---|---|
| 3,715,674 | 2/1973 | Bahr | 333/30 R X |
| 3,716,809 | 2/1973 | Reeder et al. | 333/30 R X |
| 3,781,717 | 12/1973 | Kuenemund | 333/72 X |
| 3,831,116 | 8/1974 | Davis, Jr. et al. | 333/72 |
| 3,858,118 | 12/1974 | Daniel | 333/72 X |
| 3,883,831 | 5/1975 | Williamson et al. | 333/30 R |
| 3,961,293 | 6/1976 | Hartmann et al. | 333/72 |

*Primary Examiner*—Alfred E. Smith
*Assistant Examiner*—Marvin Nussbaum
*Attorney, Agent, or Firm*—Harold Levine; James T. Comfort; William E. Hiller

[57] ABSTRACT

A tunable surface wave resonator is disclosed comprising a substrate of piezoelectric material having acoustic surface wave absorbing extremities, a pair of spaced acoustic surface wave gradient reflectors positioned adjacent to the absorbing extremities of the substrate, a pair of spaced multiphase surface wave tuning transducers selectively positioned between the pair of gradient reflectors over antinode positions of desired resonant frequency standing wave, and an acoustic surface wave transducer selectively placed for optimum coupling of energy into the acoustic resonant cavity formed by the pair of gradient reflectors.

18 Claims, 6 Drawing Figures

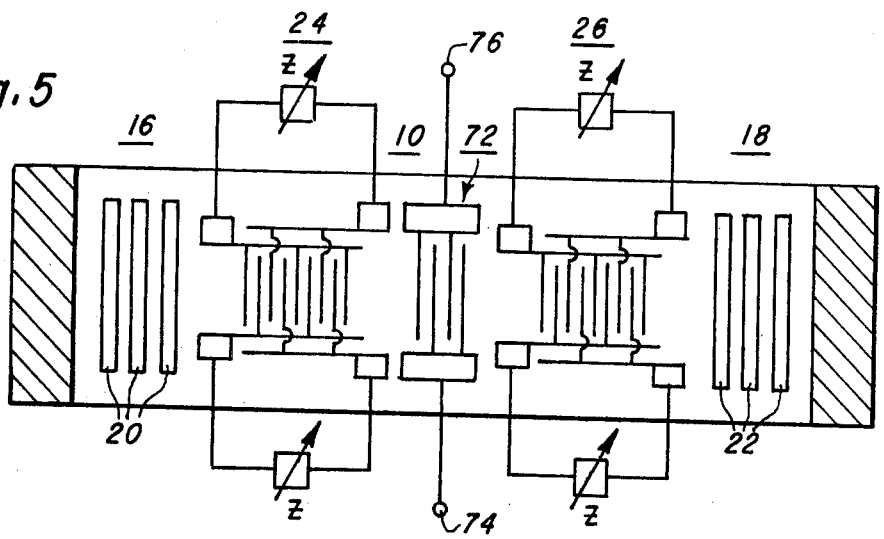
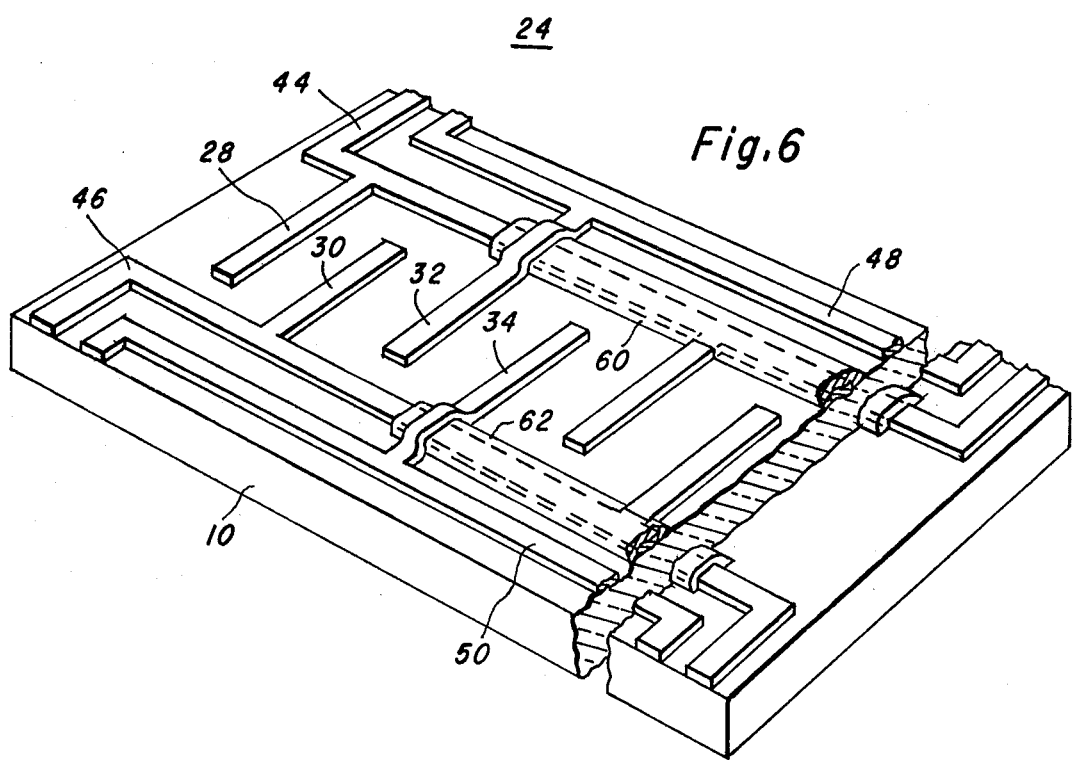

TUNABLE SURFACE WAVE DEVICE RESONATOR

This invention relates to acoustic surface wave devices, and more particularly, to a tunable surface wave resonator.

In the past, surface wave devices have found use in radar system components, communication system components, and frequency domain bandpass filters. Most of these systems involve the use of tapped delay lines with a potentially very high tap density and with the amplitude and phase at each tap capable of precise control. This feature gives surface wave devices a unique signal processing capability. The devices usually are operated at frequencies between 30 and 600 MHz, although, higher and lower frequencies have been used. Surface wave devices can have high fractional bandwidths, in theory about an octave. They are usually produced by the same photolithographic processing which is currently used for metallization in integrated circuit manufacturing.

Surface wave devices are generally fabricated upon piezoelectric substrates. The most commonly used substrates are $LiNbO_3$, ST quartz, and $Bi_{12}GeO_{20}$. Each has material parameters which make it useful under certain conditions. For example, ST quartz has the lowest temperature coefficient of delay; $LiNbO_3$ has the highest coupling constant; and $Bi_{12}GeO_{20}$ has the lowest acoustic velocity.

In simple structures, a pair of interdigital metal combs called transducers have been formed on the substrate. These combs are responsive to r-f signals which have a frequency $$f = v/l$$

where:
 $f$ = response frequency
 $v$ = velocity of substrates upon which combs are formed
 $l$ = center to center separation of adjacent comb fingers.

Each finger of the interdigital combs is a complex electrical impedance; further, each finger has a capacitance which is a function of its length. Thus, the circuit can be altered by changing the finger spacing and lengths. When an appropriate r-f signal is applied to the input comb or transducer, the material between the fingers distorts owing to the piezoelectric effect. This periodic strain leads to an acoustic wave propagating away from the input transducer in both directions with a frequency equal to that of the applied signal. In one direction, the acoustic wave has been absorbed in a lossy medium. In the other direction, the wave propagates to the output transducer and is detected by the inverse piezoelectric effect.

Surface wave devices using this structure have been used in delay lines, frequency controls, and bandpass filters. More recently, however, surface wave devices have been utilized as multi-resonant surface wave resonators. An acoustic surface wave resonator device constitutes the subject matter of U.S. Pat. application, Ser. No. 471,616, filed May 20, 1974, now U.S. Pat. No. 3,886,504 issued May 27, 1975.

Briefly stated, the acoustic surface wave resonator of the above-mentioned U.S. Pat. No. 3,886,504 includes first and second grating structures arranged in spaced aligned relationship on a substrate of piezoelectric material with at least one interdigital acoustic surface wave transducer interposed therebetween. The transducer generates acoustic surface waves in the piezoelectric material which are reflected back by the grating structures. The grating structures are positioned in relation to the transducer to set up a standing wave resonance condition from the reflection of acoustic surface waves generated by the transducer. By spacing the grating reflectors a sufficient distance from the transducer, the resulting resonant surface wave cavity can be made to have multiple resonance points. Those persons skilled in the art desiring a more detailed explanation of the multi-resonant surface wave resonator are referred to the above-mentioned U.S. Pat 3,886,504. The above-described multi-resonant surface wave resonator is useful for various types of frequency control and bandpass filtering. Nevertheless, its usefulness has been limited in that it is not tunable within its frequency band.

Accordingly, it is an object of the invention to provide an improved acoustic surface wave device.

Another object of the invention is to provide a tunable multi-resonant surface wave resonator.

Yet another object of the invention is to provide a step tunable multi-resonant surface wave resonator.

A further object of the invention is to provide a continuously variable tuned multi-resonant surface wave resonator.

Briefly stated the invention comprises a substrate of piezoelectric material, a pair of acoustic surface wave reflectors, a pair of multiphase acoustic surface wave tuning transducers, and at least one acoustic surface wave transducer. The pair of acoustic surface wave reflectors are formed in an aligned spaced relationship on the substrate and provide a resonant cavity therebetween having a plurality of resonance points. The pair of multiphase acoustic surface wave tuning transducers are positioned in an aligned spaced relationship one to the other between the pair of acoustic surface wave reflectors for effecting frequency tuning of the resonance points. And, the acoustic surface wave transducer is disposed on the substrate between the pair of multiphase acoustic surface wave tuning transducers for coupling energy into the acoustic resonant cavity.

The novel features believed to be characteristic of the invention are set forth in the appended claims.

The invention itself, however, as well as other objects and advantages thereof may best be understood by reference to the following detailed description when read in conjunction with the accompanying drawings in which:

FIG. 5 shows the structure of FIG. 4 with the surface wave transducer formed thereon; and FIG. 6 is a greatly enlarged partially cut away pictorial view of a portion of a four phase transducer utilized in the invention.

Figure 1:
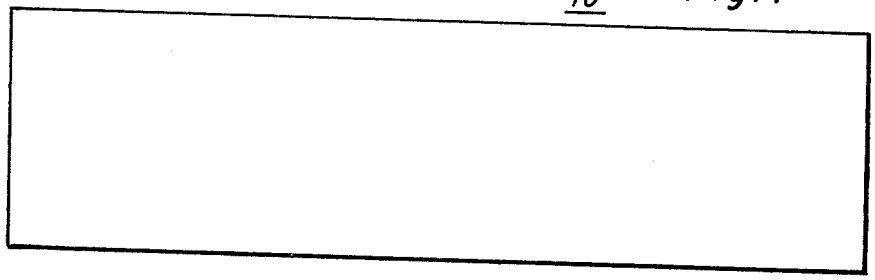
FIG. 1 is a plan view of a slab of piezoelectric material constituting the substrate for the tunable surface wave resonator.
Figure 2:
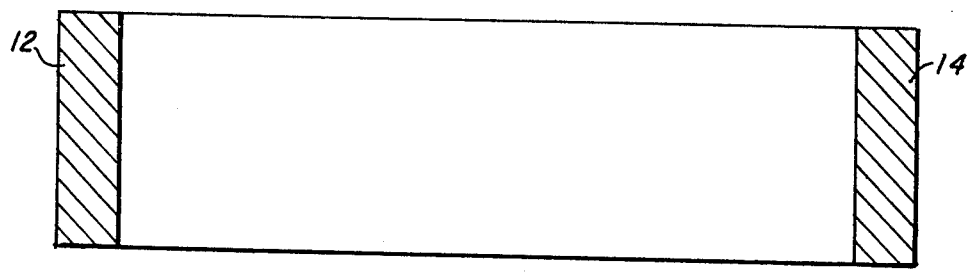
FIG. 2 shows the substrate of FIG. 1 with its extermities treated to absorb any surface waves incident thereon.

Referring to FIG. 1, the tunable multiresonant surface wave resonator comprises a substrate 10 of a piezoelectric material such as lithium niobate or quartz. The extremities 12 and 14 (FIG. 2) of substrate 10 may be suitably treated so as to affect the absorption of any surface wave incident thereon thereby preventing the reflection of surface waves from the extremities of the substrate 10. Such treatment may comprise deposition of an absorptive material at the surface of the substrate 10 in areas 12 and 14 at opposite ends thereof. A suitable absorptive material is Selastic 732 RTV.

Figure 3:
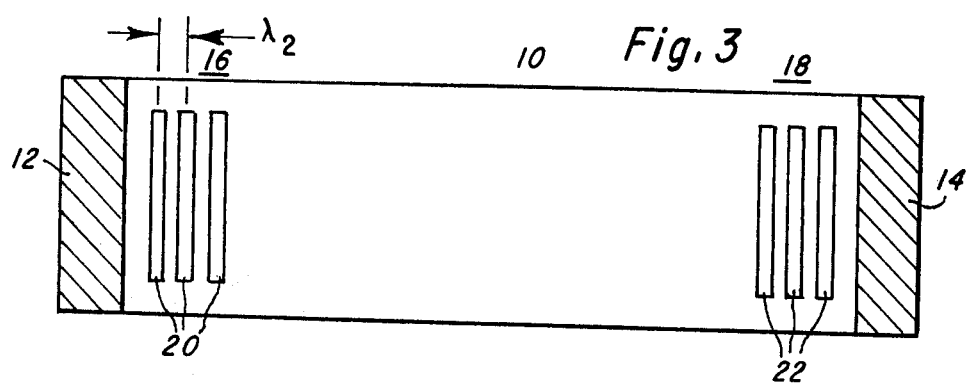
FIG. 3 shows the structure of FIG. 2 with the acoustic surface wave reflectors formed thereon.

First and second reflective grating structures 16 and 18 (FIG. 3) are provided on the substrate 10. The reflective grating structure 16 and 18 comprise respective pluralities of discontinuities 20 and 22. The discontinuities 20 and 22 are formed at the surface of substrate 10 so as to be capable of reflecting at least a portion of any surface waves incident thereon. The discontinuities 20 and 22 may be formed as a plurality of narrow, thin-film fingers or bars deposited on the surface of substrate 10 at one-half wavelength centers. The bars may be formed of an electrically conductive materials such as, for example, gold, copper, or aluminum. Alternatively they may be formed of a dielectric material such as for example, silicon oxide, silicon nitride, or zinc oxide. If desired, reflecting discontinuities 20 and 22 may be formed by selectively etching portions of the surface substrate 10. It will be understood of course that the number of discontinuities shown in FIG. 3 is illustrative only and that many more such elements may be incorporated in the grating structures. A typical number of elements 20 and 22 is 100; this number substantially enhances the total percentage of reflection of acoustic surface waves incident on the grating structures 16 and 18.

The grating structures 16 and 18 are arranged on the substrate 10 in a spaced apart, aligned relationship. The space between the grating reflectors is sufficient that the resulting resonant surface wave cavity will have multiple resonance points or modes; the purpose of which will become more clear as the description proceeds hereinafter.

The frequencies at which the cavity will be resonant are given by the following equation:

$$f_n = NV/2L$$

where:

$f_n$ = the frequency of the Nth mode
$V$ = the velocity in the cavity
$L$ = the effective cavity length
$N$ = the number of half wavelengths of standing wave in the cavity.

From this equation it is obvious that as L is varied, the frequencies at which the cavity is resonant will also change. In this invention the effective acoustic length of the cavity is altered through shorting out or weakening the piezoelectric fields that are generated in and associated with the standing waves in this cavity. Thus the shorting of these fields will alter the acoustic propagation velocity.

Tuning devices 24 and 26 (FIG. 4) which may be, for example, multiphase transducer devices are disposed on the substrate 10 in the space between the grating reflectors 16 and 18. The use of multiphase transducers as tuning elements in this cavity with variable impedance mechanism is effective because the nodes and antinodes of the standing wave associated with the resonance change position for successive resonant frequencies of this cavity. Tuning is accomplished by shorting out or weakening the electric potentials between adjacent antinodes of the electrical standing wave. As the positions of these antinodes move about for differing resonances of the cavity, it is impossible to place a normal biphase transducer such that it will be equally effective in shorting out these antinode points for all possible resonant frequencies. Placement of the multiphase transducer is less critical and more effective for tuning because there are multiple sample points on each wavelength of the resonance standing wave. Thus, by varying the impedance between portions of the multiphase transducer which, for the example shown, differ in wavelength by 180°, approximately uniform tuning is achieved for all modes of the multiresonant cavity. As stated, the tuning transducers 24 and 26 are preferably multiphase surface wave transducers. Further, the class of multiphase transducers includes all transducers with phases equal to three or more.

Figure 4:
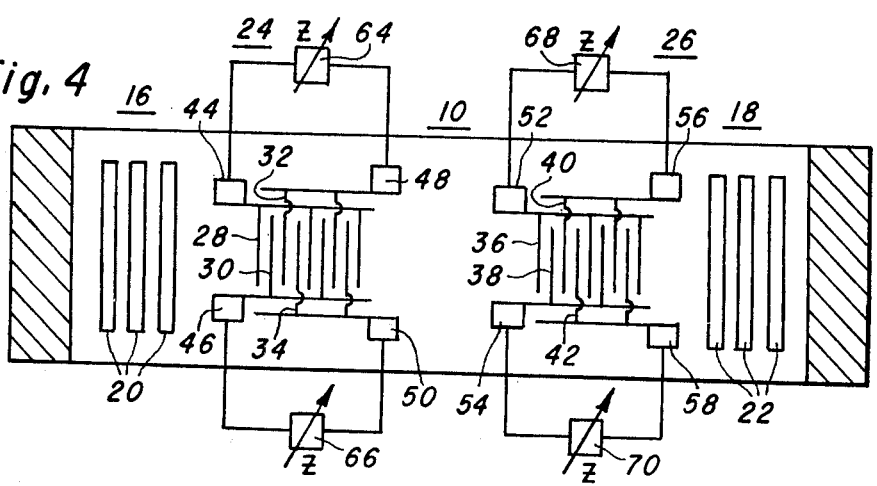
FIG. 4 shows the structure of FIG. 3 with the multiple phase surface wave tuning transducers formed thereon and the tuning mechanism coupled thereto.

FIG. 4 depicts an embodiment of the invention wherein a selected number of four arrays of electrodes are repeatably deposited upon a surface of the piezoelectric substrate 10 to provide a desired number of tuning points. Representative electrodes of the four arrays are shown generally at 28, 30, 32, and 34 for multiphase transducer 24; and 36, 38, 40 and 42 for multiphase transducer 26. The arrays of electrodes are interleaved such that one electrode from each array is included in successive acoustic wavelengths, thereby defining an interdigitated transducer having four discrete electrodes per acoustic wavelength at the resonant frequency. The electrodes 28–34 and 36–42 of the multiphase transducers 24 and 26, respectively, are essentially parallel and are electrically isolated one from the other. The electrodes may be comprised of gold, aluminum, or other suitable materials. The array of electrodes 28 of multiphase transducer 24 are commonly connected to a conductive terminal or pad 44 while the arrays of electrodes 30, 32, and 34 are, respectively, connected to terminals 46, 48, and 50. Similarly, the arrays 36, 38, 40 and 42 of multiphase transducer 26 are connected, respectively, to terminals 52, 54, 56, and 58.

Terminals 44, 48 and terminals 46, 50 are coupled, respectively, to variable impedance elements 64 and 66 of multiphase transducer 24. Similarly terminals 52, 56 and terminals 54, 58 are coupled, respectively, to variable impedance elements 68 and 70 of multiphase transducer 26. The variable impedance elements 64, 66, 68 and 70 may be, for example, simple diode switches which can be switched between either short circuit or open circuit conditions to provide a step-tuned resonator. Alternatively, varactor tuning diodes which provide a variable capacitance can be used. In the latter case by changing the electrical bias on a selected varactor tuning diode, the effective capacitance is varied to form a continuously tunable resonator device. It will be appreciated by those skilled in the art that whichever variable impedance element is used, multiple tuning transducers can be inserted into a single cavity thereby achieving several steps for the step tuned case or multiple controlled leads for the continuous tuned case.

As multiphase transducers 24 and 26 are identical in construction, only the partial construction of multiphase transducer 24 is shown in detail (FIG. 6). As shown in FIG. 6, terminals 48 and 50 are preferably formed, respectively, adjacent terminals 44 and 46. Terminals 48 and 50 are electrically insulated, respectively, from terminals 44 and 46 by layers 60 and 62 of insulating material such as, for example, silicon oxide formed over terminals 44 and 46. The arrangement of the terminals 44–50 as to one another is chosen so as to minimize inter-terminal capacitance. It will be appreciated that other arrangements may be made to obtain this result. The arrays of electrodes 28, 30, 32 and 34 including terminals 44, 46, 48, and 50 may be formed on the surface of the substrate 10 by any conventional multilevel metallization and masking technique or by other techniques useful for defining a metal pattern known to those skilled in the art. For example, the arrays of electrodes 28 and 30, including the associated terminals 44 and 46 can be formed on the substrate 10 during the first metallization step. The arrays of electrodes 32 and 34 are also deposited during this step but are floating; that is, they are not electrically connected to their conductive terminals. Insulating layers 60 and 62 are then formed over conductive terminals 44 and 46 and windows etched through the insulators at areas overlaying contact areas to electrodes 32 and 34. Insulating materials, such as, for example, SiO2 and the method of forming it, are well known in the art. A further metallization step could form terminals 48 and 50 and make contact through the windows to the array of electrodes 32 and 34. Alternatively, in the first metallization step conductive terminals 44 and 46 could be formed with tabs. These tabs extend from terminals 44 and 46 and subsequently form contact areas for the arrays of electrodes 28 and 30. Insulating layers could then be formed over terminals 44 and 46 leaving the tabs exposed. A further metallization step could then be carried out to form terminals 48 and 50 and all the arrays of electrodes 28 – 34 with electrodes 32 and 34 contacting the tabs of terminals 44 and 46. If desired three or five or even more arrays of electrodes can be formed, and similar multilevel metallization techniques used to connect the terminals to the electrodes. It will also be appreciated that other known techniques may be utilized in producing the multiphase transducer.

With reference to FIG. 5, the tunable surface wave resonator is completed with an acoustic surface wave transducer 72 formed intermediate the multiphase tuning transducers 24 and 26. This transducer is preferably a biphase interdigitated transducer. While this particular embodiment of the resonator structure has been disclosed, modification of this structure may occur to those skilled in the art. For example, a second transducer of the form of 72 may be placed in the cavity and operated in a two-port mode with one transducer acting as the input port and the second transducer acting as the output-port. For a second example, the surface wave resonator may be used in a transmission mode where either the input or output transducer or both are outside the cavity. In the single port embodiment, the device is a high Q resonant impedance element useful for oscillator control. In the two-port configuration the device is also a high Q resonant impedance element useful for oscillator control or it will also function for multi-passband filtering applications.

In operation, the transducer 72 is connected to an RF signal source. Explanation becomes simpler when the source is a swept frequency type, such as an RF spectrum analyzer. When the frequency of the source becomes equal to the resonant frequencies of the cavity ($F_{n, n+1, \ldots}$) a standing wave is generated within the cavity at each of these frequencies. This standing wave exists in the cavity between the reflector structures 16 and 18 and under the multiphase tuning transducers 24 and 26 and also under the transducer 72. For reference, consider that the electrodes of the multiphase tuning transducer which differ in phase by 180°, with reference to the standing wave, are initially open-circuited and placed over adjacent antinodes. Under this condition an initial velocity in the portion of the cavity under the multiphase tuning transducers is established and subsequently the effective cavity length, L. This condition results in the initial resonant frequencies, $F_{N, N+1, \ldots}$, of the resonator device. When an impedance element of zero impedance is affixed between the aforementioned electrodes the electric fields associated with the standing wave are shorted out. The result is a lowering of the velocity in the area under the multiphase tuning transducers and a longer effective cavity length is established. This in turn results in a new family of lower resonant frequencies for the resonator device, $F'_{N, N+1, \ldots}$. If the impedance element in the example is a switch, either mechanical or electronic, a step tuning effect is provided with a maximum frequency excursion; $\Delta f = F_{(N, N+1 \ldots)} - F'_{(N, N+1 \ldots)}$. A variable impedance element instead of a switch gives a continuously tunable resonator device.

It will be appreciated by those skilled in the art that in certain applications uniform tuning effect for all modes may not be an important criteria and thus the use of normal bi-phase transducers for tuning transducers in a multiresonant cavity is a special case under this invention.

Although several embodiments of the invention have been described herein, it will be apparent to a person skilled in the art that various modifications to the details of construction shown and described may be made without departing from the scope of this invention.

What is claimed is:

1. A tunable surface wave resonator comprising:
   a piezoelectric substrate;
   a pair of reflector arrays on said substrate, said reflector arrays being aligned in spaced parellel relation to each other and respectively disposed at the opposite outer extremities of said substrate so as to provide a multiresonant cavity therebetween;
   each of said reflector arrays comprising a plurality of spaced parallel discontinuities formed on said substrate,
   tuning means formed on the substrate in the miltiresonant cavity, said tuning means being independent of said reflector arrays and selectively positioned as to the reflector arrays to provide selective uniform tuning for all modes of the multiresonant cavity; and
   surface acoustic wave transducer means formed on said substrate and disposed between said tuning means and operably associated therewith to generate standing waves at a desired resonant frequency.

2. A tunable surface wave resonator according to claim 1 wherein said discontinuities comprise a plurality of narrow thin-filmed metal bars.

3. A tunable surface wave resonator according to claim 2 wherein the space between successive metal bars is one fourth a desired wavelength.

4. A tunable surface wave resonator according to claim 1 wherein said discontinuities are etched in the substrate.

5. A tunable surface wave resonator according to claim 1 wherein the tuning means comprises a pair of spaced surface wave tuning transducers.

6. A tunable surface wave resonator according to claim 1 wherein said surface wave transducer means comprises an interdigitated transducer forming a single port resonator.

7. A tunable surface wave resonator according to claim 6 wherein said interdigitated transducer is formed in the cavity.

8. A tunable surface wave resonator according to claim 1 wherein the surface wave transducer means comprises a pair of interdigitated transducers forming a two port resonator.

9. A tunable surface wave resonator according to claim 8 wherein the two interdigitated transducers comprise an input port transducer and an output port transducer.

10. A tunable surface wave resonator according to claim 9 wherein either the input port or output port or both are formed on the substrate outside the cavity.

11. A tunable surface wave resonator according to claim 1 further including an acoustic wave absorbing means formed on the substrate adjacent its extremities.

12. A tunable surface wave resonator comprising:
a piezoelectric substrate;
surface wave reflector means formed on said substrate, said reflector means forming with the substrate a multiresonant cavity;
tuning means formed on the substrate in the multiresonant cavity; said tuning means selectively positioned as to the reflector means to provide selective uniform tuning for all modes of the multiresonant cavity and comprising a pair of spaced multiphase surface wave tuning transducers having three or more phases; and
surface acoustic wave transducer means formed on said substrate between said pair of spaced multiphase surface wave tuning transducers and operable to generate standing waves at a desired resonant frequency.

13. A tunable surface wave resonator according to claim 12 wherein each of said pair of spaced surface wave transducers comprises an interdigitated electrode type transducer with variable impedance means coupled across terminals of the interdigitated electrodes for shorting out or weakening the electric potentials between adjacent antinodes of the cavity electrical standing wave.

14. A tunable surface wave resonator according to claim 12 wherein the pair of spaced surface wave tuning transducers are bi-phase transducers with impedance means coupled across the electrode terminals thereof.

15. A tunable surface wave resonator according to claim 13 wherein the variable impedance means includes switches.

16. A tunable surface wave resonator according to claim 14 wherein the variable impedance means includes switches.

17. A tunable surface wave resonator according to claim 15 wherein the switches are diodes for stepped tuning.

18. A tunable surface wave resonator according to claim 17 wherein the diodes are varactor diodes for continuous uniform tuning.

* * * * *